United States Patent [19]

Widder et al.

[11] Patent Number: 5,239,260
[45] Date of Patent: Aug. 24, 1993

[54] SEMICONDUCTOR PROBE AND ALIGNMENT SYSTEM

[75] Inventors: David C. Widder, Billerica; Diethelm G. Ringleb, Andover, both of Mass.

[73] Assignee: Digital Equipment Corporation, Maynard, Mass.

[21] Appl. No.: 723,168

[22] Filed: Jun. 28, 1991

[51] Int. Cl.⁵ .............................. G01R 1/02
[52] U.S. Cl. ..................... 324/158 P; 324/158 F
[58] Field of Search ............. 324/158 P, 158 F; 357/84; 439/482

[56] References Cited

U.S. PATENT DOCUMENTS

| | | | |
|---|---|---|---|
| 3,568,136 | 3/1971 | Wells | 439/912 |
| 4,103,228 | 7/1978 | Ham | 324/158 P |
| 4,426,657 | 1/1984 | Abiru et al. | 357/84 |
| 4,585,991 | 4/1986 | Reid et al. | 324/102 |
| 4,622,576 | 11/1986 | Buynoski | 357/84 |
| 4,707,655 | 11/1987 | Kruger | 439/482 |
| 4,862,076 | 8/1989 | Renner et al. | 439/912 |
| 4,921,810 | 5/1990 | Kunieda | 324/158 R |
| 4,922,192 | 5/1990 | Gross et al. | 324/158 F |
| 4,963,225 | 10/1990 | Lehman-Lamer | 324/158 P |
| 5,015,946 | 5/1991 | Janko | 324/158 F |
| 5,020,219 | 6/1991 | Leedy | 324/158 P |
| 5,055,776 | 10/1991 | Miller et al. | 324/158 F |
| 5,072,116 | 12/1991 | Kawade et al. | 324/158 P |
| 5,091,694 | 2/1992 | Ikeda et al. | 324/158 P |
| 5,126,662 | 6/1992 | Jinbo | 324/158 P |

*Primary Examiner*—Vinh Nguyen
*Attorney, Agent, or Firm*—Arnold, White & Durkee

[57] ABSTRACT

A semiconductor probe and alignment system are disclosed. The semiconductor probe includes a silicon-based substrate and membrane on which a plurality of pyramid shaped contactors are formed. Each of the contactors includes a metalized tip for contacting bonding pads on a semiconductor die. The area of the probe surrounding each contactor is thinned to form a membrane to provide flexibility and thus compliance to assure contact between each contactor and its respective bonding pad. In the alignment system, a guide wall formed from a photo-imageable material is created around at least a portion of each bonding pad to provide alignment for guiding the contactors on the probe onto the bonding pads.

5 Claims, 2 Drawing Sheets

SEMICONDUCTOR PROBE AND ALIGNMENT SYSTEM

BACKGROUND OF THE INVENTION

1. Field of the Invention

The present invention relates to methods and apparatus for contacting integrated circuits for tests before they have been packaged. More particularly, the present invention relates to test probes and methods for aligning the test probes with a semiconductor die prior to testing.

2. Prior Art

As integrated circuits have become smaller and more complex, early detection of faulty parts has become more important in managing and containing costs. Packaging costs have escalated significantly, especially with respect to the more complicated devices. In some circumstances, packaging can cost more than the silicon die itself. Accordingly, testing on the wafer or die level to eliminate faulty devices has become increasingly important. Testing of an integrated circuit at the die level requires the use of a probe card to make contact with the bonding pads on the die.

Currently, there are three probe card styles that are in general use: ceramic blade, metal blade, and epoxy ring. In each of these probe cards an array of long delicate needles or wires is attached to the probe base and the wires are cut and bent in such a way that the ends correspond to the bonding pads on the semiconductor die being tested. As semiconductor devices have become more complicated and have included more circuits, the number of bonding pads and thus, the number of wires on a probe has had to increase.

The material and length of the wires being used depends upon various factors including contact force, contact resistance, power requirements and density requirements. Even with optimization, these wire probes offer relatively poor electrical performance for high speed signals.

The fragility of the needles on a probe can also cause a number of problems. For example, they are easily bent so that they are out of alignment or do not otherwise make contact with the pad. Much of this is simply the result of the numerous touchdowns which occur as large batches of devices are tested by a single probe.

Another problem associated with these probes is proper alignment. The ends of the needles must be visually aligned with the pads to which they correspond before touchdown and contact occur. This slows down the testing process and provides another source of possible error to the testing procedure.

A new technology which is being developed to test semiconductor dies involves the use of membrane probe cards. According to this technology, a flexible, dielectric membrane supports a set of microstrip transmission lines that connect the test electronics to the pads on the die being tested. The transmission lines are formed by a conductor trace pattern on one side of the dielectric membrane. A contact bump is formed on the other side of the membrane at the end of each transmission line and is connected to the transmission line through a hole in the membrane. An example of this technology is disclosed by B. Leslie and F. Matta, "Membrane Probe Card Technology (The Future For High Performance Wafer Test)," *Proceedings IEEE International Test Conference*, pp. 601–607 (1988). Some of the advantages of this technology are discussed by C. Barsotti, S. Tremaine and M. Bonham, "Very High Density Probing," *Proceedings IEEE International Test Conference*, pp. 608–614 (1988).

While these membrane probe cards promise many advantages over the prior art, they still have certain drawbacks. First, the flexible dielectric membrane has a different coefficient of thermal expansion than the semiconductor die thus, potentially causing alignment problems when the die is tested at temperature extremes. Additionally, these probe cards require that the dielectric material be transparent so that the probes can be visually aligned with the bonding pads on the die being tested.

Accordingly, it would be an advancement in the art to provide a semiconductor probe and alignment system in which the probe is durable, permitting repeated touchdowns without the need for readjustment, and is compatible with high pin count dies. It would be a further advancement in the art if such a probe were made from materials having similar properties as the die being tested.

It would also be an advancement in the art to provide a system whereby a probe card could automatically be aligned such that the contactors made contact with the bonding pads on the die being tested.

SUMMARY OF THE INVENTION

The present invention provides a novel semiconductor probe and an alignment system which are durable, automatic and reliable.

In the preferred embodiment of the probe of the present invention, the body of the probe is formed from a silicon or silicon-based material. A series of truncated, pyramid-shaped bumps or contactors are formed on the surface of the probe with the number and spacing being designed to correspond to the bonding pads on the silicon die to be tested. A metallic contact point is formed on the top of each contactor and is connected by suitable traces to the test apparatus. The silicon body around each contactor is thinned to create a flexible, compliant membrane. This flexibility and compliance assures that the contact point on each contactor can form a solid contact with its corresponding bonding pad on the integrated circuit die.

In one embodiment of the invention metallic contact points are formed on the surface of the silicon layer and are connected by metallic traces formed according to standard technology. The surface of the silicon layer is then etched back such that the metallic contact points are positioned on the top of silicon pyramids. The silicon is etched back such that the pyramid is about 25 $\mu$m in height. The back of the silicon is then selectively etched away to form a membrane area about 10 $\mu$m thick around the base of the pyramid.

In the preferred embodiment of the alignment system of the present invention, a guide wall is formed on the surface of the dies adjacent the bond pads which will be used in testing. The guide wall can be formed of essentially any type of photo-imageable material used in the semiconductor industry. For example, suitable guide walls can be formed from polyimides. The guide walls have a height which is greater than the bonding pad and is substantially less the width of the bonding pad. These guide walls help guide the contact points on the probe onto the bonding pads.

The guide walls can be formed by placing a stripe of a photo-sensitive material such as a polyimide around the perimeter of each die to be tested so that it covers the bonding pads. The stripe is then photo-imaged and developed so that the pad is exposed while leaving a wall 10 to 20 microns high around the pads.

While it is possible to create a guide wall which completely surrounds each bonding pad, it is not necessary to do so as long as sufficient guide walls are provided on the die to ensure that all of the contactors are correctly aligned with their corresponding bonding pads. For example, in one preferred embodiment the guide wall is formed only along the inner edge of the bonding pads.

A probe such as described above is mounted on a suitable test board or probe card with the contactors facing upward. A die having guide walls formed thereon is then placed on top of the test probe and is positioned as close to the proper alignment as possible using rough guides which engage the edges of the die. The probe and die are then vibrated such that the guide walls and pyramid-shaped contactors interact causing the contact points on the probe to align with and engage the proper bonding pads on the die.

While the automatic alignment system of the present invention is designed to operate in conjunction with the semiconductor probes of this invention, it will be appreciated that the alignment system can also be used with other types of membrane probes. Additionally, the probes of this invention can be used in test systems using visual alignment methods.

BRIEF DESCRIPTION OF THE DRAWINGS

The invention is best understood by reference to the following detailed description of the preferred embodiments when read in conjunction with the accompanying drawings in which like elements have been given like numerals and wherein.

DETAILED DESCRIPTION OF THE PREFERRED EMBODIMENTS

The present invention provides a novel semiconductor probe and an alignment system for testing and/or burning in bare, unpackaged semiconductor dies. The invention is best understood by reference to the drawings which illustrate various embodiments of the present invention.

Figure 1:
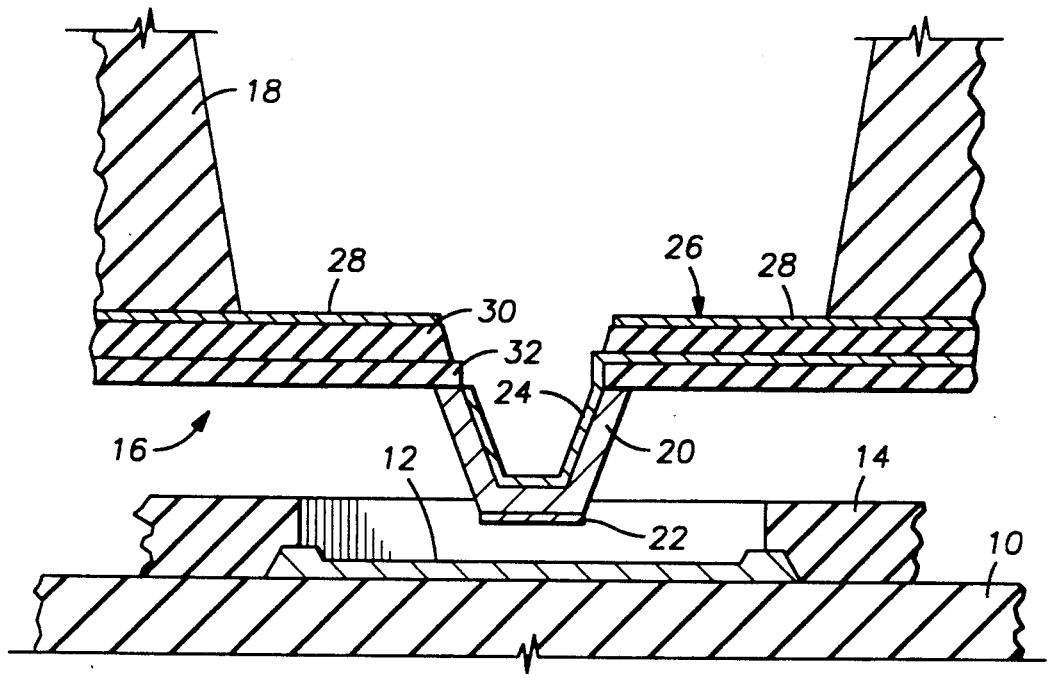
FIG. 1 is a cross-sectional view of a first embodiment of a semiconductor probe and modified die according to the present invention.

Referring first to FIG. 1, a semiconductor die 10 having a bonding pad 12 formed on the surface thereof is illustrated in cross-section. Semiconductor die 10 and bonding pad 12 could be any type of conventional integrated circuit. A guide wall 14 is formed on the surface of die 10 surrounding bonding pad 12.

Guide wall 14 is formed by placing a stripe of a photo-sensitive material around the perimeter of die 10 such that it covers all of the bonding pads 12. The photo-sensitive material can be selected from any of the photo-sensitive materials commonly used in the semiconductor industry. In the preferred embodiment, guide wall 14 is formed from a polyimide material. After the stripe of material has been placed on die 10 it is photo-imaged and developed so that the pad is exposed while leaving a wall 10 to 15 microns high around each pad.

The height of the wall can be varied depending upon the other dimensions of the die, the bonding pads, and the probe to be used. A height-to-width ratio of about 1:10 is required to cause most geometric shapes to align and self-seat. A normal bonding pad is about 90 microns wide and the passivation around it is only 1 micron high. Accordingly, the addition of a guide wall about 10 microns in height around the bonding pad will facilitate self-alignment of a suitable probe onto the bonding pad.

Figure 3:
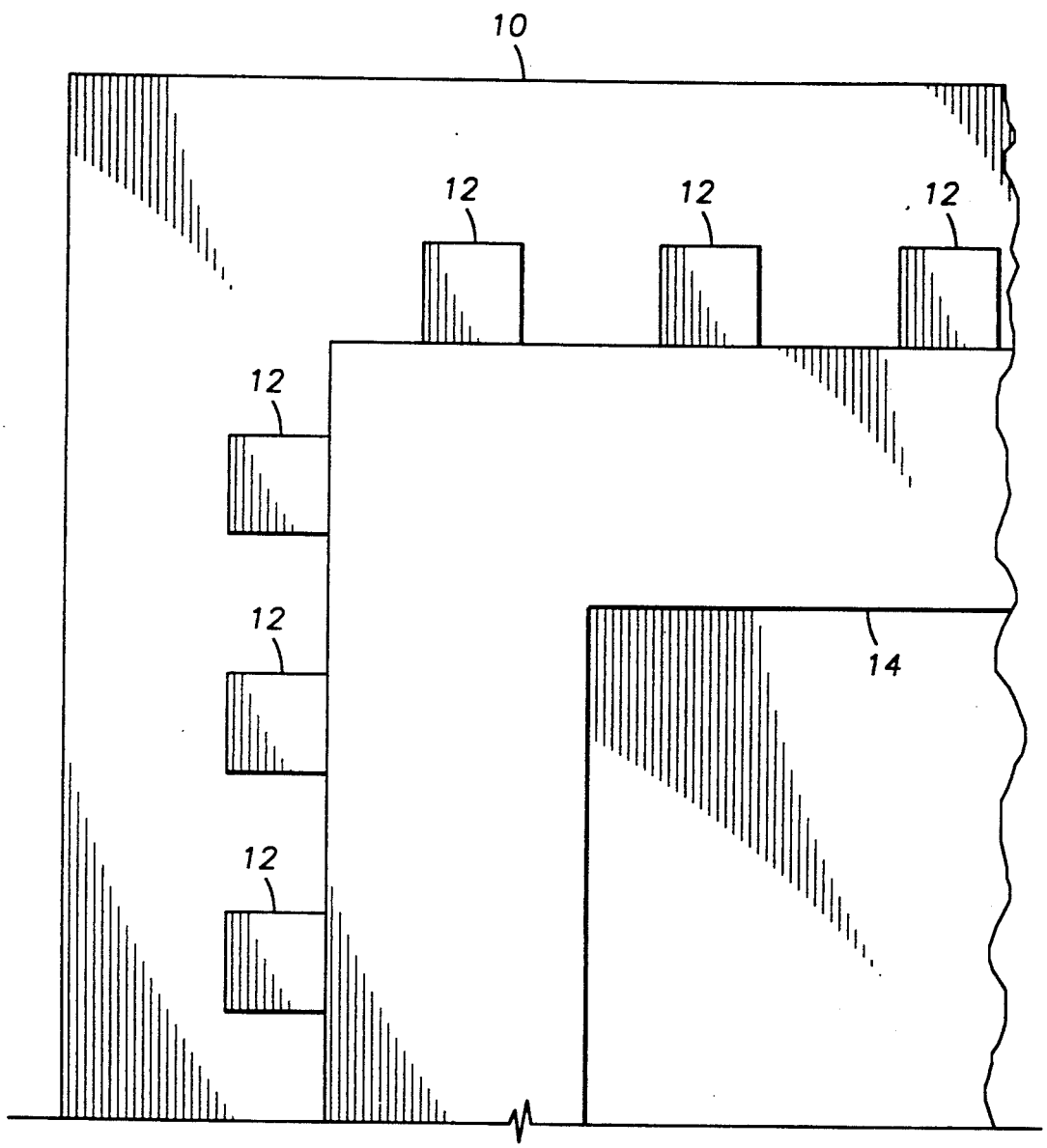
FIG. 3 is a top view of a portion of a semiconductor die showing a preferred embodiment of the present invention.

While the embodiment illustrated in FIG. 1 utilizes a guide wall which completely surrounds each bonding pad, it will readily be appreciated by those skilled in the art that the guide wall does not have to be this complete. Depending upon the number and size of bonding pads on the die, the guide wall can be formed in only selected areas so long as there is sufficient wall to guide and align all of the probe contactors onto their corresponding bonding pads. For example, the guide wall can be formed along only the inner side of each bonding pad as illustrated in FIG. 3. Alternatively, the guide wall could be formed around only selected pads. Such alternatives will be readily apparent to those skilled in the art.

With continued reference to FIG. 1, a first embodiment of a semiconductor probe according to the present invention is generally designated at 16. Probe 16 comprises a body formed from one or more layers of silicon or silicon-based materials. Additional layers of other materials can be formed on and between the layers of silicon.

A pyramid shaped contactor 20 formed from silicon projects from probe 16 and is designed such that it can engage bonding pad 12 on die 10. Additional pyramids are formed on probe 16 to correspond to each bonding pad on the die to be tested. While the preferred contactor shape is a pyramid, it will be appreciated that other shapes such as truncated cones can also be used. The essential feature is that the sides of the contactor be sloped to cooperate with the guide walls on the die to cause automatic alignment and seating when the probe and die are vibrated. The shape is also controlled by the manor in which silicon can be etched.

A metallic contact point 22 is formed on the tip of pyramid 20. In the preferred embodiment, contact point 22 is formed from gold. A gold signal tracing 24 is formed on the backside of pyramid 20 and extends to the edge of probe 16 where it can be connected by suitable means to a test board or probe card. In the illustrated embodiment, pyramid 20 is formed from pure silicon or silicon which has been doped such that it is conductive to allow power from tracing 24 to be transmitted to bonding pad 12.

Probe 16 also includes a membrane portion 26 which is formed from silicon or a silicon-based material and has been thinned out to provide flexibility and compliance to insure proper contact of point 22 with pad 12. Membrane portion 26 can be formed from any of a number of different silicon-based materials. In the illustrated embodiment, membrane 26 is formed from layers 30 and 32. It acts as a dielectric as well as providing flexibility and compliance. Therefore it can be formed from materials such as suitably doped silicon, silicon nitride, or silicon dioxide.

A gold layer 28 is formed on top of membrane portion 26 to act as a reference plane. A silicon base or substrate 18 is formed on or adhered to layer 28 to provide strength to probe 16. Substrate 18 and layers 30 and 32 generally form the body of probe 16.

By forming substrate 18 and membrane portion 26 from a silicon or silicon-based material, probe 16 has the same coefficient of thermal expansion as the die being tested. Accordingly, die 10 can be tested at temperature extremes without creating alignment problems with probe 16.

Figure 2:
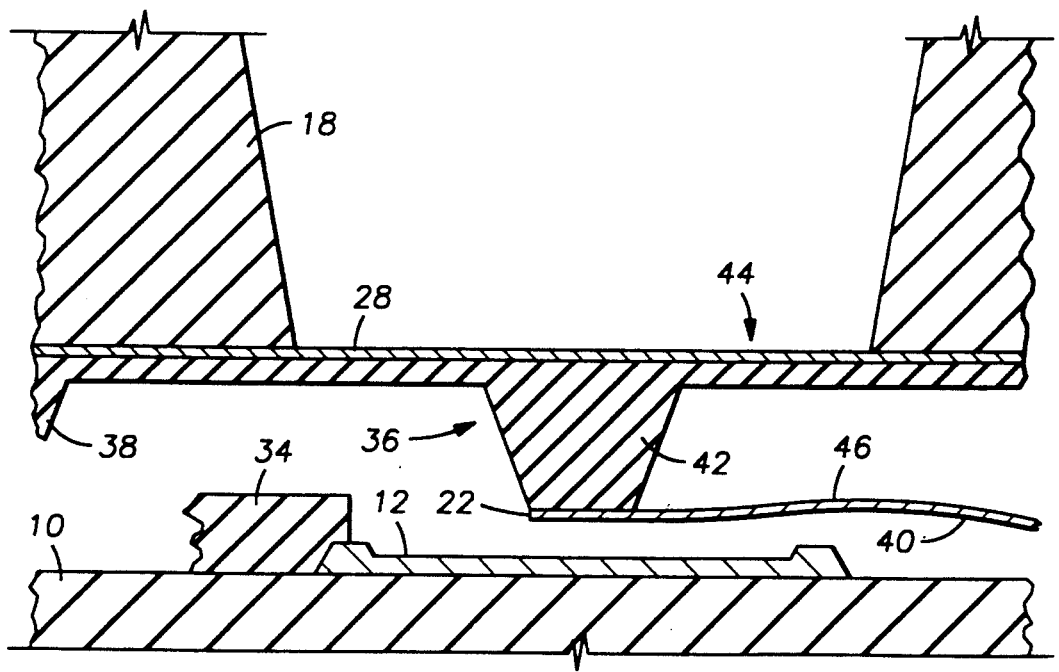
FIG. 2 is a cross-sectional view of a second preferred embodiment of a semiconductor probe and modified die according to the present invention.

Reference is next made to FIG. 2 which illustrates a second preferred embodiment of the semiconductor probe of the present invention. In this embodiment, the probe is generally referred to at 36.

Probe 36 also includes a base or substrate 18 having a gold layer 28 formed thereon to act as a reference plane. A dielectric layer 38 of silicon or a silicon-based material is then formed over gold layer 28. Substrate 18 and dielectric layer 38 form the body of probe 36.

A gold contact point 22 is formed on dielectric layer 38 along with a suitable gold signal trace 40 by which probe 36 can be connected to a test board. Dielectric layer 38 is selectively etched such that it creates a pyramid shaped contactor 42 beneath contact point 22. Base 18 is also selectively etched down to gold layer 28 around contactor 42 such that it cooperates with dielectric layer 38 to form a relatively thin membrane portion 44. Contact point 22 can then be securely positioned on bonding pad 12 to provide a good electrical connection for testing of die 10.

In the embodiment of FIG. 2, a guide wall 34 has been formed on die 10 similar to guide wall 14 in FIG. 1. However, in the embodiment illustrated in FIG. 2, guide wall 34 is only formed along one side of bonding pad 12. By forming guide wall 34 on only one side of bonding pad 12, it does not unduly interfere with gold bridge 46 which remains after dielectric layer 38 has been selectively etched away.

The semiconductor probes of the present invention provide several advantages over the prior art. First, since they are made from silicon or a siliconbased material, they are relatively rugged and have the same coefficient of thermal expansion as does the die being tested. Thus, the contact points remain in place and the die can be tested at temperature extremes without creating alignment problems with the probe. Additionally, the contact points on the probe can be formed with the same accuracy as the bonding pads on the semiconductor die since they are formed utilizing the same technology.

While the probes of the present invention can be visually aligned and used with conventional semiconductor dies, it is preferable to use these probes in conjunction with the automatic alignment system of the present invention. The automatic alignment system includes the formation of guide walls around the bonding pads on the semiconductor die.

When utilizing this system, the probe is mounted on a suitable test board or probe card in a test fixture with the contractors facing upward. An individual die to be tested is then placed on top of the probe and roughly aligned by its edges. The probe is then vibrated to cause the die to align itself precisely and drop over the contactors. A vacuum can be used to assist in the docking and aligning of the die and to hold it in place during testing. Alternatively, a positive air stream which is applied to the back surface of the die can be used. The amplitude and frequency of the vibration used during alignment can also be varied to cause a penetration of any oxides or other contaminants which may have been formed on the bonding pads.

While the invention has been described with respect to the presently preferred embodiments, it will be appreciated by those skilled in the art that many modifications or changes can be made without departing from the scope or essential characteristics of the invention. For example, different types of materials and configurations can be used for the guide walls as well as different configurations for the probe contactors. Additionally, the body of the probe can be formed from many different silicon layer configurations. Accordingly, the foregoing description is meant to be illustrative and not restrictive and the following claims are intended to embrace all such modifications and changes.

What is claimed is:

1. A semiconductor probe alignment system comprising:
    a semiconductor die having bonding pads thereon and a guide wall adjacent said bonding pads; and
    a probe mounted on a suitable probe card, said probe having a plurality of pyramid shaped contactors extending from a surface thereof, said contactors corresponding to the bonding pads on said die and being small enough and shaped such that said contactors interact with said guide wall on said die to align the contactors with the bonding pads and move past the guide wall into contact with the bonding pads.

2. A semiconductor probe alignment system according to claim 1 wherein said guide wall surrounds at least a portion of each bonding pad.

3. A semiconductor probe alignment system according to claim 1 wherein said guide wall is formed only along the inner side of each bonding pad.

4. A semiconductor probe alignment system according to claim 1 wherein said guide wall is formed from a photo-imageable material.

5. A semiconductor probe alignment system according to claim 4 wherein said guide wall is formed from a polyimide.

* * * * *